(12) United States Patent
Wu et al.

(10) Patent No.: US 11,417,797 B2
(45) Date of Patent: Aug. 16, 2022

(54) MICRO LIGHT EMITTING DIODE AND MANUFACTURE METHOD THEREFOR

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xinfeng Wu, Beijing (CN); Fei Li, Beijing (CN); Huihui Li, Beijing (CN); Xinzhu Wang, Beijing (CN); Youyuan Hu, Beijing (CN); Jinxia Hu, Beijing (CN); Xiaotian Zhang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 105 days.

(21) Appl. No.: 16/902,358

(22) Filed: Jun. 16, 2020

(65) Prior Publication Data
US 2021/0028329 A1    Jan. 28, 2021

(30) Foreign Application Priority Data
Jun. 27, 2019 (CN) .......................... 201910572702.X

(51) Int. Cl.
*H01L 33/10* (2010.01)
*H01L 33/00* (2010.01)
*H01L 33/06* (2010.01)

(52) U.S. Cl.
CPC .......... *H01L 33/10* (2013.01); *H01L 33/0095* (2013.01); *H01L 33/06* (2013.01); *H01L 33/0008* (2013.01)

(58) Field of Classification Search
None
See application file for complete search history.

(56) References Cited

U.S. PATENT DOCUMENTS

| | | | |
|---|---|---|---|
| 5,952,681 A | 9/1999 | Chen | |
| 8,278,676 B2* | 10/2012 | Kojima | H01L 33/405 |
| | | | 257/98 |

(Continued)

FOREIGN PATENT DOCUMENTS

| | | |
|---|---|---|
| CN | 1619849 A | 5/2005 |
| CN | 1770489 A | 5/2006 |

(Continued)

OTHER PUBLICATIONS

First Office Action, including Search Report, for Chinese Patent Application No. 201910572702.X, dated Aug. 26, 2020, 17 pages.

*Primary Examiner* — Bradley Smith
(74) *Attorney, Agent, or Firm* — Westman, Champlin & Koehler, P.A.

(57) ABSTRACT

Provided is a micro-LED device, comprising: a light emitting unit comprising a light emitting layer having a first end surface, a second end surface opposite to the first end surface, and a lateral surface between the first end surface and the second end surface; a P-type semiconductor layer on the first end surface; and an N-type semiconductor layer on the second end surface; a transparent insulating layer covering at least the lateral surface of the light emitting layer; and a reflecting layer on a side of the transparent insulating layer away from the light emitting unit, wherein the transparent insulating layer insulates the light emitting unit from the reflecting layer, and the reflecting layer covers at least the lateral surface of the light emitting layer.

12 Claims, 2 Drawing Sheets

(56) References Cited

U.S. PATENT DOCUMENTS

| | | | |
|---|---|---|---|
| 2005/0110032 A1 | 5/2005 | Saito et al. | |
| 2006/0065901 A1 | 3/2006 | Aoyagi et al. | |
| 2013/0270592 A1* | 10/2013 | Reiherzer | H01L 33/0095 257/98 |
| 2015/0221835 A1* | 8/2015 | Tischler | H01L 33/0095 438/27 |
| 2017/0051411 A1* | 2/2017 | Kologe | C23C 18/1844 |
| 2019/0198562 A1* | 6/2019 | Schubert | H01L 27/156 |
| 2020/0091225 A1* | 3/2020 | Yang | H01L 25/0753 |

FOREIGN PATENT DOCUMENTS

| | | |
|---|---|---|
| CN | 101412783 A | 4/2009 |
| CN | 101826516 A | 9/2010 |
| CN | 202585519 U | 12/2012 |
| CN | 102867730 A | 1/2013 |
| CN | 103275657 A | 9/2013 |
| CN | 107201200 A | 9/2017 |
| CN | 108183117 A | 6/2018 |

* cited by examiner

MICRO LIGHT EMITTING DIODE AND MANUFACTURE METHOD THEREFOR

CROSS REFERENCE TO RELATED APPLICATION

The present application claims a priority from Chinese Patent Application No. 201910572702.X, filed on Jun. 27, 2019, with a title of "Micro light emitting diode and manufacture method therefor", the entirety of which is incorporated herein by reference.

TECHNICAL FIELD

The present disclosure relates to the technical field of light emitting device, and particularly to a micro light emitting diode and a manufacture method therefor.

BACKGROUND

Light emitting diode (LED) is a kind of electroluminescent element, and has advantages of low energy consumption, small size, high luminance, easy matching with integrated circuit, and high reliability. Therefore, LED is widely used as a light source. Micro light emitting diode (Micro-LED) has become an important research direction in display industry in recent years because of its features of low energy consumption, wide color gamut of natural light, rapid response, and ease of use in high resolution devices.

Generally, a micro-LED device is mounted in an array substrate. The micro-LED device comprises a P-type semiconductor layer on one end, an N-type semiconductor layer on the other end, and a light emitting layer therebetween. When the light emitting layer emits light, a portion of light may be output from a lateral surface (i.e., a portion between the two semiconductors on both ends) of the micro-LED device, and may enter a nearby organic layer region and a neighboring thin film transistor (TFT) region, resulting in reduced luminescence efficiency and color mixing.

In this regard, a technical solution has been proposed, comprising disposing a horn mouth (horn hole) on the array substrate, disposing a metal reflecting layer on a lateral wall of the horn mouth, and subsequently mounting the micro-LED device in the horn mouth, thereby preventing the light output from the micro-LED device from entering the TFT region and thus increasing the light output. However, it is difficult to form a uniform and high quality reflecting film on the lateral wall of the horn mouth in the array substrate. In addition, there is a large distance between the reflecting film and the micro-LED device, and the passivating layer filled therein will result in light loss.

Therefore, there is a need for mitigating the lateral light leakage of the micro-LED device.

SUMMARY

In one aspect, the present disclosure provides a micro-LED device, comprising:
a light emitting unit comprising:
a light emitting layer having a first end surface, a second end surface opposite to the first end surface, and a lateral surface between the first end surface and the second end surface;
a P-type semiconductor layer on the first end surface; and
an N-type semiconductor layer on the second end surface;
a transparent insulating layer covering at least the lateral surface of the light emitting layer; and
a reflecting layer on a side of the transparent insulating layer away from the light emitting unit,
wherein the transparent insulating layer insulates the light emitting unit from the reflecting layer, and the reflecting layer covers at least the lateral surface of the light emitting layer.

Optionally, the reflecting layer is a nickel-phosphorous alloy layer or a silver layer.

Optionally, the reflecting layer further covers lateral surfaces of the P-type semiconductor layer and the N-type semiconductor layer.

Optionally, the light emitting layer is a quantum well light emitting layer.

Optionally, at least one of the P-type semiconductor layer and the N-type semiconductor layer is transparent.

Optionally, external electrode-connecting portions of the P-type semiconductor layer and the N-type semiconductor layer are not covered by the transparent insulating layer.

Optionally, the micro-LED device further comprises at least one of an electron injection layer, an electron transport layer, a hole transport layer, and a hole injection layer.

In another aspect, the present disclosure provides a light emitting device comprising the above-mentioned micro-LED device.

Optionally, the light emitting device further comprises:
an array substrate comprising a TFT,
wherein one of the P-type semiconductor layer and the N-type semiconductor layer of the micro-LED device is electrically connected to a drain electrode of the TFT.

Optionally, the array substrate has a groove for accommodating the micro-LED device.

Optionally, the P-type semiconductor layer and the N-type semiconductor layer of the micro-LED device are connected to a cathode and an anode respectively, wherein the anode is electrically connected to the drain electrode of the TFT.

Optionally, at least one of the cathode and the anode is transparent.

In yet another aspect, the present disclosure provides a method for manufacturing the above-mentioned micro-LED device, comprising:
providing a micro-LED device having a transparent insulating layer, the transparent insulating layer covering at least a lateral surface of a light emitting layer between a P-type semiconductor layer and an N-type semiconductor layer; and
forming a reflecting layer on the transparent insulating layer located on a lateral surface of the micro-LED device by electroless plating.

Optionally, the electroless plating is a nickel-phosphorous electroless plating or a silver electroless plating.

Optionally, the method further comprises, before forming the reflecting layer by electroless plating, forming a temporary protecting layer on a surface of the micro-LED device not intended to have the reflecting layer formed thereon.

Optionally, the temporary protecting layer is formed with a temperature-active pressure-sensitive adhesive material.

Optionally, the temperature-active pressure-sensitive adhesive material is a cooling-type (temperature-dependent) acid-resistant acrylate copolymer.

Optionally, the method further comprises, after completing the electroless plating, removing the temporary protecting layer by cooling the device to a threshold temperature or less.

Optionally, after forming the temporary protecting layer, a surface of the micro-LED device to be plated is subjected to a pretreatment.

Optionally, the pretreatment comprises subjecting the surface to be plated to a sensitization treatment and an activation treatment.

BRIEF DESCRIPTION OF DRAWINGS

To more clearly illustrate the technical solutions in the embodiments of the present disclosure, the drawings to be used in the description of embodiments will be briefly introduced below. Obviously, the drawings in the following description are only some exemplary embodiments of the present disclosure, and other drawings can be obtained by those skilled in the art according to these drawings without inventive efforts.

DETAILED DESCRIPTION

The technical solutions in embodiments of the present disclosure will be detailedly described below with reference to particular embodiments of the present disclosure. Obviously, the embodiments and/or examples described are only a part of, not all of the embodiments and/or examples of the present disclosure. All of other embodiments and/or examples obtained by those skilled in the art based on the embodiments and/or examples described, without inventive efforts, fall within the protection scope of the present disclosure.

Figure 1:
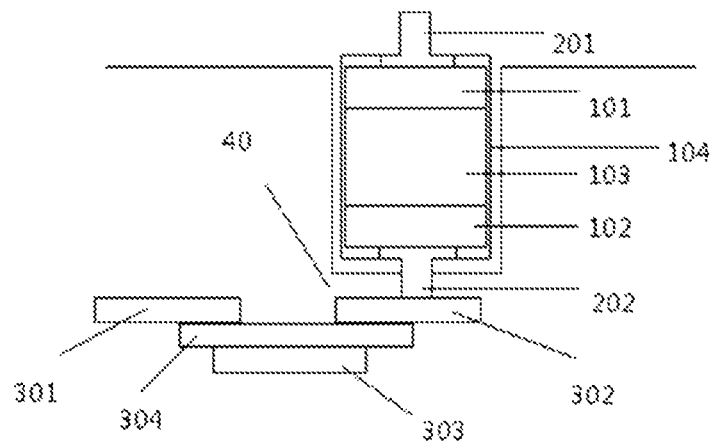
FIG. 1 illustrates a schematic diagram of a micro-LED device mounted in an array substrate according to the related art.

FIG. 1 illustrates a schematic diagram of a micro-LED device mounted in an array substrate according to the related art. The thin film transistor (TFT) in the array substrate comprises a source electrode 301, a drain electrode 302, a gate electrode 303 and an active layer 304. The drain electrode 302 is electrically connected to the micro-LED device mounted in the array substrate, such that the micro-LED device can be controlled through the gate electrode. The micro-LED device comprises a P-type semiconductor layer 101, an N-type semiconductor layer 102, and a light emitting layer 103 therebetween. The light emitting layer 103 may be a quantum well light emitting layer, for example. The upper and lower ends (i.e., the P-type semiconductor layer 101 and the N-type semiconductor layer 102) of the micro-LED device are respectively connected to electrodes 201 and 202, for example, a cathode 201 and an anode 202, wherein the anode 202 is connected to the drain electrode 302. At least one of the cathode and the anode is transparent to allow light output. In this drawing, the light exiting side is the top side, that is, the cathode 201 is transparent. It should be noted that the micro-LED device per se may have bare surfaces or metal terminals for connecting with the electrodes 201 and 202 at ends of the P-type semiconductor layer 101 and the N-type semiconductor layer 102 respectively, and other portions of the micro-LED device may have a transparent insulating protecting layer 104 thereon. As such, when a voltage is applied to the micro-LED device through the electrodes 201 and 202, the device will emit light. The micro-LED device may further comprise a conventional functional layer such as an electron/hole transport layer and an electron/hole injection layer. Other optional nearby structures such as a planarization layer and a passivating layer exist between the TFT and the micro-LED device, and are designated as 40 in the drawing.

In the case of the micro-LED device mounted in the array substrate as shown in FIG. 1, the light emitted by the quantum well 103 may, besides being output from the upper end surface, also be output from the lateral surface of the micro-LED device, thereby entering the nearby structures 40 of the array substrate, or further entering the TFT and an adjacent micro-LED device.

Figure 2:
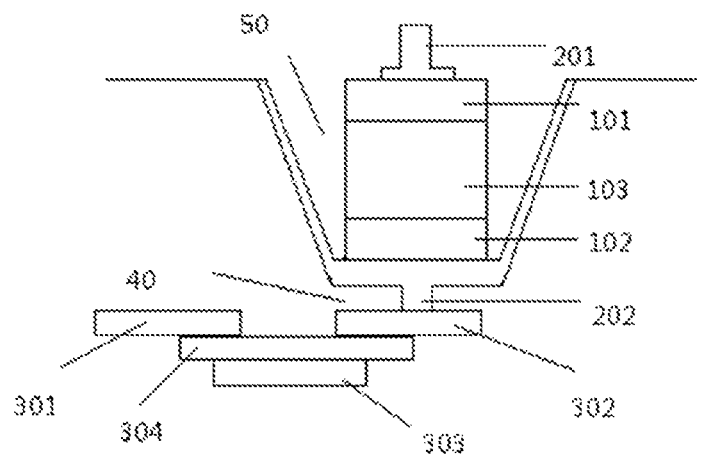
FIG. 2 illustrates an array substrate with a reflecting function according to the related art.

FIG. 2 illustrates an array substrate with a reflecting function according to the related art. As compared to FIG. 1, a horn mouth-shaped groove is formed in the nearby structures in the technical solution of FIG. 2. A metal anode 202 is fabricated on the array substrate, and extends to the inner surface of the horn mouth-shaped groove. As such, an array substrate with a groove having a reflecting layer on its inner surface is obtained. Subsequently, the micro-LED device is mounted in the groove. In this way, the reflecting layer prevents the light output from the lateral surface of the micro-LED device from affecting the nearby structures 40 and the TFT.

Although the technical solution as shown in FIG. 2 can solve the problem of lateral light output to some extent, it still has the following drawbacks. First, it is difficult to form a metal thin film in the horn mouth-shaped groove on the array substrate. It is also difficult to form a reflecting metal film with uniform thickness and high quality on the inner surface of the groove by technologies such as evaporation. Second, in order to conveniently mount the micro-LED device, the groove is required to be much larger than the micro-LED device, and after mounting the micro-LED device, a filler 50 such as a passivating layer should be filled between the groove and the micro-LED device. The large thickness of the filler will cause light loss.

Figure 3:
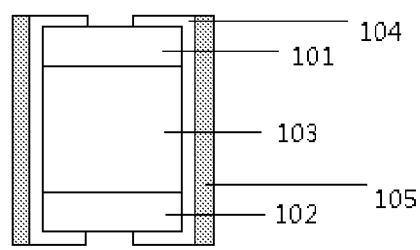
FIG. 3 illustrates a structure of a micro-LED device according to an embodiment of the present disclosure.

FIG. 3 illustrates a structure of a micro-LED device according to an embodiment of the present disclosure. The device comprises:

a light emitting unit comprising:
  a light emitting layer 103 having a first end surface, a second end surface opposite to the first end surface, and a lateral surface between the first end surface and the second end surface;
  a P-type semiconductor layer 101 on the first end surface; and
  an N-type semiconductor layer 102 on the second end surface;
a transparent insulating layer 104 covering at least the lateral surface of the light emitting layer 103; and
a reflecting layer 105 on a side of the transparent insulating layer 104 away from the light emitting unit,
wherein the transparent insulating layer 104 insulates the light emitting unit from the reflecting layer 105, and the reflecting layer 105 covers at least the lateral surface of the light emitting layer 103 (that is, when viewed from the lateral surface of the light emitting unit, a projection of the reflecting layer 105 on the light emitting unit covers at least the lateral surface of the light emitting layer 103).

As shown in FIG. 3, the light emitting layer 103, together with the P-type semiconductor layer 101 and the N-type semiconductor layer 102 disposed respectively on the two ends of the light emitting layer 103, form the light emitting unit of the micro-LED device, wherein electrons and holes can migrate from the semiconductor into the light emitting layer and recombine therein to emit light. Typically, the light emitting unit has a columnar structure formed by stacking a plurality of layers. The light emitting unit may also comprise a functional layer of a convention LED, such as an electron/hole transport layer and an electron/hole injection layer, as long as it does not adversely affect the technical effects of the present disclosure. Generally, at least one semiconductor layer is transparent to allow light output.

In the micro-LED device as shown in FIG. 3, the top and bottom directions are referred to as end directions, and the surface between the ends is referred to as a lateral surface. The micro-LED device may be columnar. If so, the ends thereof are respectively the top surface and the bottom surface, and the lateral surface is the lateral surface of the column.

The micro-LED device further comprises a transparent insulating layer 104. The transparent insulating layer 104 covers at least the lateral surface of the light emitting layer 103. As such, the reflecting layer 105 subsequently formed thereon as described below can indirectly cover the lateral surface of the light emitting layer 103 to reflect the light output from the lateral surface of the light emitting unit, thereby preventing adverse effects on the nearby TFT. The transparent insulating layer 104 may also cover other surfaces of the light emitting unit. As shown in FIG. 3, the transparent insulating layer 104 may cover the majority of the outer surface of the light emitting unit, including the lateral surface of the light emitting layer 103, the lateral surfaces of the P-type semiconductor layer 101 and the N-type semiconductor layer 102, and a portion of the end surfaces. A portion not covered by the transparent insulating layer 104 may exist on the end surfaces of the P-type semiconductor layer 101 and the N-type semiconductor layer 102, such that external electrodes can be connected to the semiconductor layers. However, the transparent insulating layer may not cover the ends of the light emitting unit, and the transparent insulating layer may not completely cover the lateral surface of the semiconductor layer.

In the present disclosure, the term "covering" includes direct covering with contacting each other, and indirect covering via an intermediate layer.

It is noted that in typical micro-LED devices which are industrially produced or commercially available, a transparent insulating layer is already formed for providing insulation and protection to the light emitting unit of the micro-LED device. Therefore, the processes and materials for the transparent insulating layer in the related art can be used to form the transparent insulating layer 104 of the present disclosure.

The micro-LED device further comprises a reflecting layer 105 on the outside surface of the transparent insulating layer 104. The transparent insulating layer 104 insulates the light emitting unit from the reflecting layer 105. The reflecting layer 105 is configured to cover at least the lateral surface of the light emitting layer 103.

In short, due to the fact that the reflecting layer 105 covers at least the lateral surface of the light emitting layer 103, the light output from the lateral surface of the light emitting layer 103 can be reflected inwardly, as a result, the influence on the nearby structures and TFT is reduced and the luminance of the Micro-LED device is increased.

The reflecting layer 105 may also cover a portion of the surfaces of the P-type semiconductor layer 101 and the N-type semiconductor layer 102. Those skilled in the art can appropriately select particular configuration of the reflecting layer 105 depending on the size of the light emitting unit to ensure the blocking and reflecting of the light.

The micro-LED device of the present disclosure may further comprise other common components and structures in the Micro-LED device, such as metal ports on both ends of the light emitting unit for connecting with external electrodes.

The present disclosure provides a micro-LED device owning a lateral reflecting layer by itself. As compared to the micro-LED device without reflecting layer, the micro-LED device of the present disclosure can prevent the output light from leaking from the lateral surface of the micro-LED device, thereby avoiding the influence on the nearby structures and TFT. As compared to the technical solution of disposing a reflecting layer in the array substrate, the reflecting layer in the micro-LED device of the present disclosure has a uniform thickness and a good quality, and the overall cost for forming the display device is low. The micro-LED device owning a lateral reflecting layer can be directly mounted on a conventional array substrate.

Optionally, the reflecting layer is a nickel-phosphorous alloy layer or a silver layer. Both the nickel-phosphorous alloy layer and the silver layer can be easily obtained by electroless plating, and have sufficient reflectivity and low cost.

Optionally, the reflecting layer further covers lateral surfaces of the P-type semiconductor layer and the N-type semiconductor layer. This can further increase the reflection of the light output form the lateral surface of the light emitting unit. Moreover, when the whole lateral surface of the light emitting unit is covered by reflecting layer, such a reflecting layer is easy to be formed. For example, in the electroless plating method described in detail below, there is no need to form a temporary protecting layer on the lateral surface of the light emitting unit, thereby further simplifying the electroless plating process.

Optionally, the light emitting layer is a quantum well light emitting layer. The quantum well light emitting layer is beneficial for miniaturizing the micro-LED device and improving the luminescence performances.

The micro-LED device of the present disclosure is applicable in a light emitting device. In the present disclosure, the light emitting device comprises a display device, a lighting device, and so on, as long as it can utilize the micro-LED device to emit light.

Thus, the present disclosure also provides a light emitting device comprising the above-mentioned micro-LED device. Such a light emitting device has a better luminance in the light emitting direction.

Figure 4:
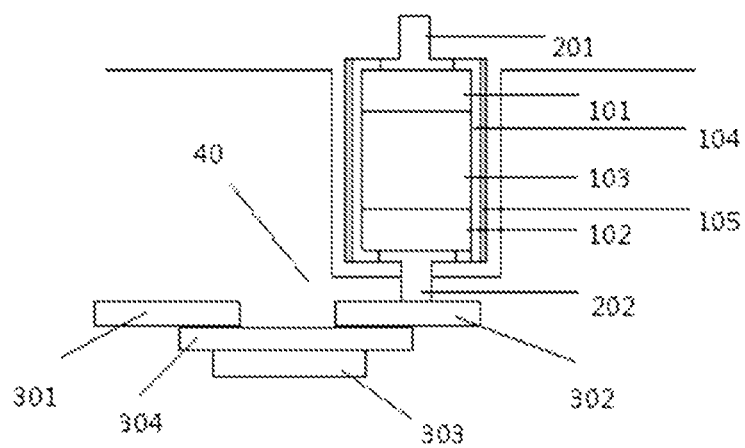
FIG. 4 illustrates a schematic diagram of the micro-LED device according to an embodiment of the present disclosure mounted in an array substrate.

Optionally, the light emitting device further comprises: an array substrate comprising a TFT, wherein one of the P-type semiconductor layer or the N-type semiconductor layer of the above-mentioned micro-LED device is electrically connected to a drain electrode of the TFT. In such a light emitting device, the light output from the lateral surface of the micro-LED device causes less influence on the nearby array substrate. FIG. 4 illustrates a schematic diagram of the micro-LED device according to an embodiment of the present disclosure mounted in an array substrate. FIG. 4 differs from FIG. 1 in that the micro-LED device owns a reflecting layer 105 by itself, which can increase the light output, reduce the influence on the nearby structures 40 and TFT, and prevent the occurrence of color mixing.

The light emitting device can be formed by a method comprising: forming electric circuits as required and groove for accommodating micro-LED device in predetermined positions of the array substrate, and subsequently, effectively placing the micro-LED device into the groove by device transferring.

The micro-LED device of the present disclosure can emit a colored light, and each micro-LED device can serve as a light emitting element of one pixel in the display device.

Different from the array substrate having a horn mouth-shaped groove with a reflecting layer as shown in FIG. 2, the micro-LED device of the present disclosure can be applicable directly in an existing array substrate without specially fabricating a shaped array substrate. And more importantly, the reflecting layer is directly formed on the micro-LED device of the present disclosure, such a reflecting layer has a uniform thickness and a good quality, and can be fabricated easily and conveniently, and the overall cost of the device is low.

One reason for which the reflecting layer of the micro-LED device of the present disclosure has uniform thickness and good quality may be attributed to the fact that the reflecting layer of the micro-LED device can be formed by electroless plating. By contrast, the reflecting layer in the array substrate cannot be formed by electroless plating, but can only be formed by a complicated method such as evaporation and photolithography, and generally needs a mask specially fabricated.

Forming the reflecting layer by electroless plating at least includes the following advantages:

1) the plating layer has a uniform thickness, without significant edge effect;

2) by means of pretreatments such as sensitization and activation, the electroless plating can be performed on a surface of a non-metal, ceramic or semiconductor material;

3) the process is simple, and it is only required in operation to suspend the device properly in the plating solution; and 4) since the principle thereof relies on the autocatalysis activity of the base material, the binding force is good, and the plating layer has characteristics of bright appearance, fine grains, compactness, low porosity and so on.

The reflecting layer may be a metal layer, an alloy layer, or any layer capable of providing a good reflecting performance. In comprehensive consideration of various aspects such as cost, process simplicity and convenience, and reflecting capability, a nickel-phosphorous alloy layer or a silver layer can be selected to be electroless plated as the reflecting layer. In the present disclosure, the nickel-phosphorous alloy layer and the silver layer are taken as the examples of the reflecting layer. It should be understood that other reflecting layers may also be formed.

Nickel and phosphorous electroless plating, also referred to as nickel electroless plating, is a process in which nickel ions in a nickel salt solution are reduced to metal nickel under an action of a strong reductant of sodium hypophosphite, while sodium hypophosphite is degraded to produce phosphorous, such that a Ni—P alloy plating layer is obtained on a plated object having a catalytic surface. The theory thereof can be elucidated from the following reactions:

(1) the chemical deposition of Ni—P alloy plating solution is performed by means of the catalysis of metal, and hypophosphite ions ($H_2PO^{2-}$) are dehydrogenated in the aqueous solution to form phosphite ions ($HPO_3^{2-}$) and to simultaneously generate nascent state atomic hydrogens;

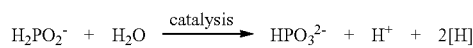

(2) the nascent state atomic hydrogens are adsorbed onto the catalytic metal surface to be activated, facilitating the reduction of nickel ions ($Ni^{2+}$) in the plating solution to deposit metal nickel)($Ni^0$) on the catalytic metal surface;

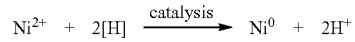

(3) it can be seen from the reaction mechanisms of those two processes that the nickel ions are reduced and the hypophosphite ions are oxidized;

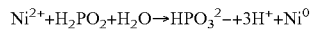

(4) the nascent state atomic hydrogens on the catalytic metal surface reduce hypophosphite ($H_2PO^{2-}$) into phosphorous)($P^0$), and hypophosphite is degraded by catalysis to form phosphite and molecular state hydrogen; and

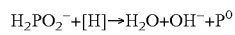

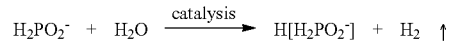

(5) nickel atoms and phosphorous atoms are co-deposited to form the Ni—P alloy layer.

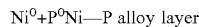

Nickel and phosphorous electroless plating is required to occur on a matrix material surface with catalytic activity. In order to obtain a plating layer having good performances in the micro-LED, an activating layer having a catalytic activity is pre-deposited on the surface to be plated, as needed in the surface electroless plating process.

Silver electroless plating may be performed by using a plating solution formed by mixing a silver salt solution and a reductant solution. The silver salt solution may be formulated from silver nitrate and aqueous ammonia, for example, and formaldehyde, glucose, tartrate, hydrazine sulfate, or so on may be used as the reductant.

As shown in FIG. 3, for example, the top end and the bottom end of the micro-LED device may not be covered with the reflecting layer. To this end, a temporary protecting layer can be provided on the top end and the bottom end, before performing the electroless plating.

One optional example of the material for temporary protecting layer is a temperature-active pressure-sensitive adhesive material. The temperature-active pressure-sensitive adhesive material is a pressure sensitive material whose adhesiveness varies with the temperature, as a result, the temporary protecting layer can be conveniently removed by changing the temperature. More specifically, a cooling-type acid-resistant acrylate copolymer may be used as the temperature-active pressure-sensitive adhesive material. This material has no pressure-sensitive adhesiveness at a temperature below the threshold temperature, while at a temperature above the threshold temperature, the adhesiveness of the material increases rapidly and the material has a good pressure-sensitive adhesiveness. Therefore, the material is suitable for use as a protecting layer for the electroless plating.

For example, the temperature-active pressure-sensitive adhesive material of cooling-type acid-resistant acrylate copolymer is adhered to the top end and bottom end of the light emitting unit under a condition above the threshold temperature, to form protecting layers thereon, with only the lateral surface of the light emitting unit being exposed. An electroless plating is performed to deposit a reflecting layer on the lateral surface of the light emitting unit and the outer surfaces of the protecting layers on the top end and bottom end of the light emitting unit. Subsequently, the device is cooled to a temperature below the threshold temperature, and the protecting layers which lose their adhesiveness are removed, thereby obtaining a reflecting layer as shown in FIG. 3.

The temperature-active pressure-sensitive adhesive material removed can be reused, for example, it can be used as a temporary protecting layer again in subsequent electroless plating.

An example for manufacturing the micro-LED device of the present disclosure, where the reflecting layer is a nickel-phosphorous alloy layer, will be described in detail below.

A micro-LED device was commercially purchased. The micro-LED device had a transparent insulating layer coated outside, and exposed electrode ports on two ends.

End protecting layers, which were made from a temperature-active pressure-sensitive adhesive material sheet of cooling-type long side chain-containing acrylate copolymer, were adhered on both ends of the micro-LED device, with only the lateral surface of the micro-LED device being exposed. The temperature-active pressure-sensitive adhesive material lost adhesiveness at a temperature below 5° C.

Subsequently, a conventional nickel and phosphorous electroless plating process was performed. Particular steps may be as described below.

The lateral surface was cleaned and then dried. After that, the micro-LED device was placed in a hydrofluoric acid solution and roughened for a period of time (1-2 min). The surface of the roughened device was made hydrophilic.

A sensitization process was performed in an aqueous $SnCl_3$ solution. After sensitization, the device was washed with deionized water. The sensitization was to adsorb a layer of reducible material on the roughened surface.

The sensitized device was further activated. For the nickel-phosphorous alloy layer to be plated, the device was placed in a palladium chloride solution for activation. The activation was to deposit a layer of continuous and uniformly distributed metal particles on the surface, said metal particles functioning as crystallization activation centers for further deposition of the plating metal. After the activation, the device was washed with deionized water.

The device was placed in an electroless plating solution for plating. The electroless plating solution may comprise a nickel salt and sodium hypophosphite, as well as a complexing agent, a stabilizer, an accelerator, a buffer, a brightener, a wetting agent and so on.

A plurality of micro-LED devices may be fixed on one substrate, and immersed into the electroless plating solution for batch plating. The thickness of the plating layer may be controlled by adjusting parameters such as pH value and temperature.

After completing the plating, the device was taken out, then washed and dried. Subsequently, the device was cooled to a temperature below 5° C. and the temporary protecting layer was removed taking advantage of the characteristic of the temperature-active pressure-sensitive adhesive material losing adhesiveness at a temperature below 5° C., thereby obtaining the micro-LED device of the present disclosure. The temperature-active pressure-sensitive adhesive material may be recovered and reused.

By the above method, a micro-LED device comprising a lateral reflecting layer was obtained. The micro-LED device of the present disclosure can effectively increase the intensity of the output light and decrease the influence on the nearby structures and TFT by making use of the reflection, and the manufacturing process is simple and convenient.

An example for obtaining the light emitting device of the present disclosure will be described in detail below.

The light emitting device was manufactured by using a conventional method in the art for forming a light emitting device on an array substrate comprising TFT with a micro-LED device, except that the micro-LED device used was the micro-LED device of the present disclosure. The method comprises forming electric circuits as required and groove for accommodating the micro-LED device in predetermined positions of the array substrate, and subsequently placing the micro-LED device effectively into the groove by device transferring. Because the device of the present disclosure comprises a lateral reflecting layer, the intensity of the output light can be effectively increased and the influence on the nearby structures and TFT can be reduced, and the manufacturing process is simple and convenient.

Obviously, modifications and variations on the embodiments of the present disclosure can be made by those skilled in the art without departing from the spirit and scope of the present application. As such, if these modifications and variations fall within the scopes of the claims of the present application or equivalent technologies thereof, the present application is intended to encompass these modifications and variations.

What is claimed is:

1. A method for manufacturing a micro-LED device, wherein the micro-LED device comprises: a light emitting unit comprising: a light emitting layer having a first end surface, a second end surface opposite to the first end surface, and a lateral surface between the first end surface and the second end surface; a P-type semiconductor layer on the first end surface; and an N-type semiconductor layer on the second end surface; a transparent insulating layer covering at least the lateral surface of the light emitting layer; and a reflecting layer on a side of the transparent insulating layer away from the light emitting unit, and the transparent insulating layer insulates the light emitting unit from the reflecting layer, and the reflecting layer covers at least the lateral surface of the light emitting layer, wherein the method comprises:

providing the micro-LED device having the transparent insulating layer, the transparent insulating layer covering at least the lateral surface of the emitting layer between the P-type semiconductor layer and the N-type semiconductor layer; and forming the reflecting layer on the transparent insulating layer located on the lateral surface of the micro-LED device by electroless plating;

wherein the method further comprises, before forming the reflecting layer by electroless plating, forming a temporary protecting layer on a surface of the micro-LED device not intended to have the reflecting layer formed thereon.

2. The method according to claim 1, wherein the electroless plating is a nickel-phosphorous electroless plating or a silver electroless plating.

3. The method according to claim 1, wherein the temporary protecting layer is formed with a temperature-active pressure-sensitive adhesive material.

4. The method according to claim 3, wherein the temperature-active pressure-sensitive adhesive material is a cooling-type acid-resistant acrylate copolymer.

5. The method according to claim 4, wherein
the method further comprises, after completing the electroless plating, removing the temporary protecting layer by cooling the device to a threshold temperature or less.

6. The method according to claim 1, wherein
after forming the temporary protecting layer, a surface of the micro-LED device to be plated is subjected to a pretreatment.

7. The method according to claim 6, wherein
the pretreatment comprises subjecting the surface to be plated to a sensitization treatment and an activation treatment.

8. The method according to claim 1, wherein
the reflecting layer further covers lateral surfaces of the P-type semiconductor layer and the N-type semiconductor layer.

9. The method according to claim 1, wherein
the light emitting layer is a quantum well light emitting layer.

10. The method according to claim 1, wherein
at least one of the P-type semiconductor layer and the N-type semiconductor layer is transparent.

11. The method according to claim 1, wherein
external electrode-connecting portions of the P-type semiconductor layer and the N-type semiconductor layer are not covered by the transparent insulating layer.

12. The method according to claim 1, wherein
the micro-LED device further comprises at least one of an electron injection layer, an electron transport layer, a hole transport layer, and a hole injection layer.

* * * * *